US010148257B1

(12) United States Patent
Lin (10) Patent No.: US 10,148,257 B1
(45) Date of Patent: Dec. 4, 2018

(54) METHOD AND APPARATUS FOR GENERATING TWENTY-FIVE PERCENT DUTY CYCLE CLOCK

(71) Applicant: Realtek Semiconductor Corp., Hsinchu (TW)

(72) Inventor: Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 15/956,937

(22) Filed: Apr. 19, 2018

(51) Int. Cl.
*H03K 3/017* (2006.01)
*H03K 3/027* (2006.01)
*H03K 5/08* (2006.01)

(52) U.S. Cl.
CPC .............. *H03K 3/017* (2013.01); *H03K 3/027* (2013.01); *H03K 5/08* (2013.01)

(58) Field of Classification Search
CPC .......... H03K 3/017; H03K 5/08; H03K 3/027; H03K 5/1565; G05F 1/06
See application file for complete search history.

(56) References Cited

U.S. PATENT DOCUMENTS

| 6,535,037 B2 * | 3/2003 | Maligeorgos | .......... H03B 19/14 327/116 |
| 8,712,357 B2 * | 4/2014 | Panikkath | .............. G01R 13/02 455/118 |

* cited by examiner

Primary Examiner — Jung Kim
(74) Attorney, Agent, or Firm — McClure, Qualey & Rodack, LLP (57) ABSTRACT

A clock generator and method operate by receiving an input clock; cascading a first inverter, a second inverter, a third inverter, and a fourth inverter in a ring topology to output a first phase, a second phase, a third phase, and a fourth phase of an interim clock; enabling the second inverter and the fourth inverter during a first phase of the input clock and enforcing a complementary relation between the second phase and the fourth phase of the interim clock by using a fifth inverter and a sixth inverter configured in a cross-coupling topology; enabling the first inverter and the third inverter during a second phase of the input clock and enforcing a complementary relation between the first phase and the third phase of the interim clock by using a seventh inverter and an eighth inverter configured in a cross-coupling topology.

20 Claims, 6 Drawing Sheets

METHOD AND APPARATUS FOR GENERATING TWENTY-FIVE PERCENT DUTY CYCLE CLOCK

BACKGROUND OF THE DISCLOSURE

Field of the Disclosure

The present disclosure generally relates to generation of quadrature clock and more particularly to methods and circuits for generating quadrature clocks.

Description of Related Art

Figure 1A:
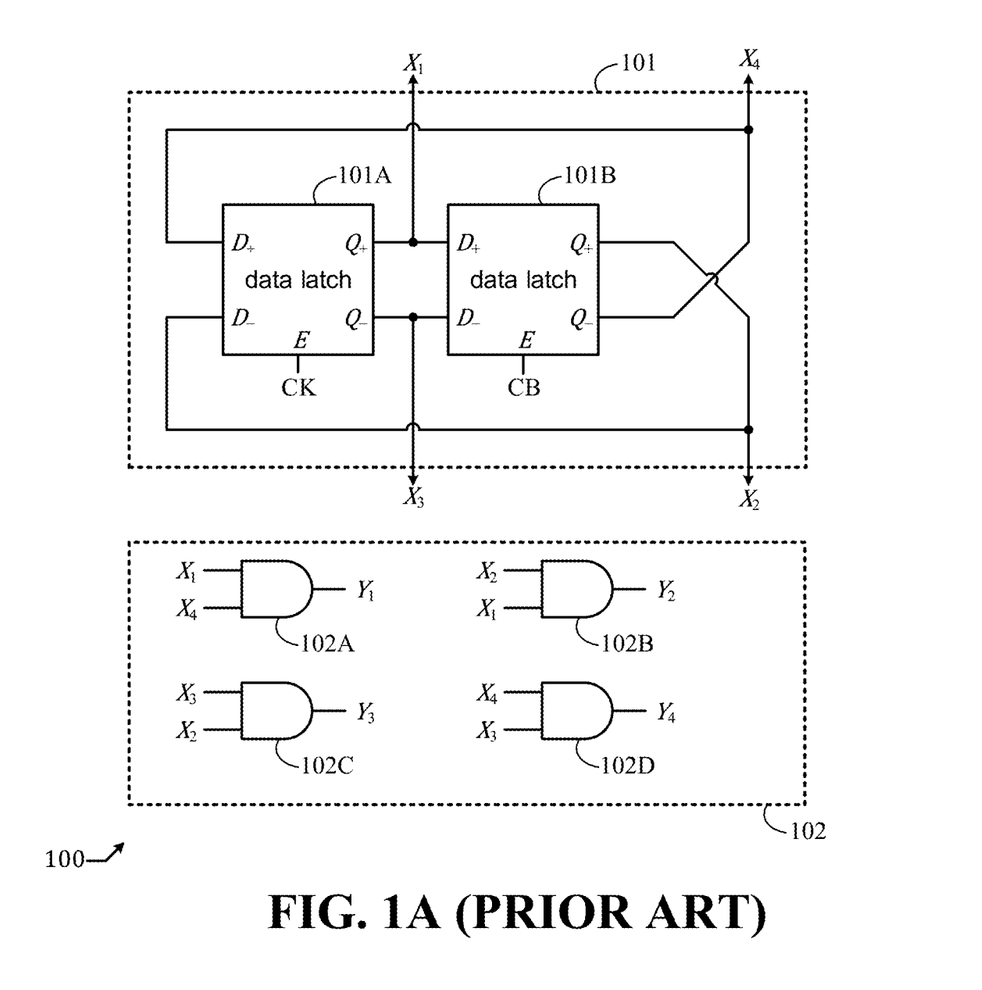
FIG. 1A shows a schematic diagram of a prior art clock generator.

Quadrature clocks are widely used in radio transceivers. In some applications, a quadrature clock with a 25% duty cycle is needed. FIG. 1A depicts a conventional clock generator circuit. As depicted in FIG. 1A, a prior art 25% duty quadrature clock generator 100 comprises: a divide-by-two circuit 101 configured to receive a two-phase clock comprising a first phase CK and a second phase CB and output a four-phase, 50% duty clock comprising a first phase $X_1$, a second phase $X_2$, a third phase $X_3$, and a fourth phase $X_4$; and a 50% to 25% duty conversion circuit 102 comprising four AND gates 102A, 102B, 102C, and 102D configured to receive the four-phase, 50% duty clock and output a four-phase, 25% duty clock comprising a first phase $Y_1$, a second phase $Y_2$, a third phase $Y_3$, and a fourth phase $Y_4$. Let a fundamental period of the two-phase clock be T. The fundamental period of the four-phase, 50% duty clock will be 2T, and there is a timing difference of T/2 between $X_1$ ($X_2$, $X_3$, $X_4$) and $X_2$ ($X_3$, $X_4$, $X_1$), where an edge of $X_1$ ($X_2$, $X_3$, $X_4$) arrives earlier than a subsequent edge of $X_2$ ($X_3$, $X_4$, $X_1$) by a time of T/2. The divide-by-two circuit 101 comprises a first data latch 101A and a second data latch 101B configured in a ring topology with a negative feedback, wherein each of the two data latches 101A and 101B has two input pins labeled by "$D_+$," and "$D_-$," two output pins labeled by "$Q_+$" and "$Q_-$," and an enabling pin labeled by "E." The first (second) data latch 101A (101B) receives $X_4$ ($X_1$) and $X_2$ ($X_3$) via its two input pins "$D_+$" and "$D_-$," respectively, outputs $X_1$ ($X_2$) and $X_3$ ($X_4$) via its two output pin pins "$Q_+$" and "$Q_-$," respectively, and works in accordance with CK (CB) via its enabling pin "E." AND gate 102A (102B, 102C, 102D) receives $X_1$ ($X_2$, $X_3$, $X_4$) and $X_4$ ($X_1$, $X_2$, $X_3$) and output $Y_1$ ($Y_2$, $Y_3$, $Y_4$). Since there is a timing difference of T/2 between $X_1$ ($X_2$, $X_3$, $X_4$) and $X_4$ ($X_1$, $X_2$, $X_3$) there is an overlap of T/2 in timing where $X_1$ ($X_2$, $X_3$, $X_4$) and $X_4$ ($X_1$, $X_2$, $X_3$) are both high and therefore $Y_1$ ($Y_2$, $Y_3$, $Y_4$) is high. As a result, $X_1$, $X_2$, $X_3$, and $X_4$ all have 25% duty cycle and are evenly spaced in time.

Figure 1B:
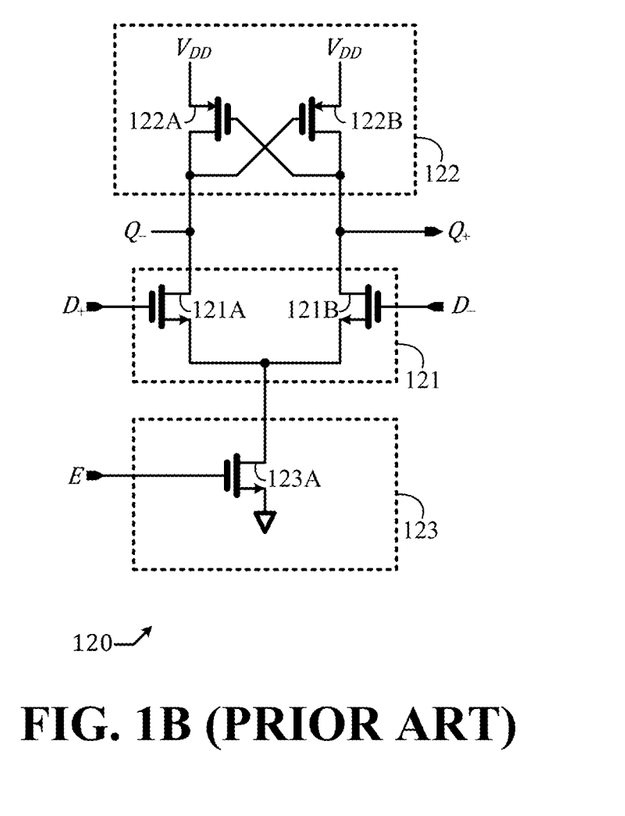
FIG. 1B shows a schematic diagram of a data latch.

A schematic diagram of a data latch 120 that can be instantiated to embody the two data latches 101A and 101B is shown in FIG. 1B. Data latch 120 comprises a differential pair 121, a cross-coupling pair 122, and a switch 123. Throughout this disclosure, "$V_{DD}$" denotes a power supply node. The differential pair 121 comprises a first NMOS (n-channel metal oxide semiconductor) transistor 121A and a second NMOS transistor 121B configured to receive a differential input signal received from the two input pins "$D_+$" and "$D_-$," and output a differential output signal to the two output pins "$Q_+$" and "$Q_-$." The cross-coupling pair 122 comprises a first PMOS (p-channel metal oxide semiconductor) transistor 122A and a second PMOS transistor 122B, wherein PMOS transistor 122A is configured to receive the voltage at pin "$Q_+$" via its gate and regenerate the voltage at pin $Q_-$" via its drain, while PMOS transistor 122B is configured to receive the voltage at pin "$Q_-$" via its gate and regenerate the voltage at pin "$Q_+$" via its drain. The switch 123 comprises a third NMOS transistor 123A, controlled by a control voltage received from the enabling pin "E" and configured to provide a discharge path for the differential pair 121 when enabled. For brevity, hereafter the voltages at pins "$D_+$," "$D_-$," "$Q_+$," "$Q_-$," and "E" are simply referred to as "$D_+$," "$D_-$," "$Q_+$," "$Q_-$," and "E," respectively. When "E" is high (low), the switch 123 is switched on (off) to allow (disallow) the differential pair 121 to update a state of the cross-coupling pair 122; as such, the data latch 120 is in an active (a frozen) state and the state of the cross-coupling pair 122 is updated (latched).

There is an issue with the data latch 120. When "$Q_+$" is low, "$Q_-$" is high, "$D_+$" is high, and "$D_-$" is low, "$Q_-$" and "$Q_+$" should toggle in response to a low-to-high transition of "E." The toggling occurs in two stages: an early stage, followed by a late stage. During the early stage of the toggling where "$Q_-$" has not fallen sufficiently low to turn on PMOS transistor 122B, "$Q_+$" stays at low since both NMOS transistor 121B and PMOS transistor 122B are in an off state, while "$Q_-$" is being pulled down by NMOS transistor 121A in the presence of contention from PMOS transistor 122A that strives to hold "$Q_-$" at high. During the late stage of the toggling where "$Q_-$" has fallen sufficiently low to turn on PMOS transistor 122B, "$Q_-$" continues to fall, while "$Q_+$" is being pulled up by PMOS transistor 122B. Using a large width-to-length ratio for PMOS transistors 122A and 122B will slow down the early stage of the toggling since the contention from PMOS transistor 122A will be strong; using a small width-to-length ratio for PMOS transistors 122A and 122B will slow down the late stage of the toggling since the pull-up of PMOS transistor 122B will be weak. Therefore, the speed of the toggling is hindered, one way or the other.

There is also an issue with the 25% duty quadrature clock generator 100 that hinders a high-speed application. AND gate is usually embodied by a NAND gate followed by an inverter. NAND gate is generally a slow circuit and a heavy load to its preceding circuit. Therefore, the 50% to 25% duty conversion circuit 102 is not only slow itself but also slows down data latches 101A and 101B.

What is desired is a method to speed up both the divide-by-two circuit and the 50% to 25% duty conversion circuit.

SUMMARY OF THE DISCLOSURE

In an embodiment, a clock generator comprises a divide-by-two circuit configured to receive an input clock and output an interim clock, and a duty converter configured to receive the interim clock and output an output clock, wherein: the divide-by-two circuit comprises eight inverters; the duty converter comprises four buffers; a first, a second, a third, and a fourth inverter among said eight inverters are configured in a ring topology to output a first, a second, a third, and a fourth phase of the interim clock, respectively; the second and the fourth inverter are enabled during a first phase of the input clock; the first and the third inverter are enabled during a second phase of the input clock; a fifth and a sixth inverter among said eight inverters are configured in a cross-coupling topology to enforce a complementary relation between the second and the fourth phase of the interim clock; a seventh and an eighth inverter of said eight inverters are configured in a cross-coupling topology to enforce a complementary relation between the first and the third phase of the interim clock; a first, a second, a third, and a fourth buffer among said four buffers are configured to receive the first, the second, the third, and the fourth phase of the interim clock and output a first, a second, a third, and a fourth phase of the output clock, respectively; the first and the third buffers are enabled during the first phase of the input clock or reset otherwise; and the second and the fourth buffer are enabled during the second phase of the input clock or reset otherwise.

In an embodiment, a method comprises: receiving an input clock; cascading a first inverter, a second inverter, a third inverter, and a fourth inverter in a ring topology to output a first phase, a second phase, a third phase, and a fourth phase of an interim clock; enabling the second inverter and the fourth inverter during a first phase of the input clock and enforcing a complementary relation between the second phase and the fourth phase of the interim clock by using a fifth inverter and a sixth inverter configured in a cross-coupling topology; enabling the first inverter and the third inverter during a second phase of the input clock and enforcing a complementary relation between the first phase and the third phase of the interim clock by using a seventh inverter and an eighth inverter configured in a cross-coupling topology; and incorporating a first buffer, a second buffer, a third buffer, and a fourth buffer to receive the first phase, the second phase, the third phase, and the fourth phase of the interim clock and output a first phase, a second phase, a third phase, and a fourth phase of an output clock, respectively, wherein the first buffer and the third buffers are enabled during the first phase of the input clock or reset otherwise, while the second buffer and the fourth buffer are enabled during the second phase of the input clock or reset otherwise.

DETAILED DESCRIPTION OF THIS DISCLOSURE

The present disclosure is directed to clock generation. While the specification describes several example embodiments of the disclosure considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the disclosure.

Persons of ordinary skill in the art understand terms and basic concepts related to microelectronics that are used in this disclosure, such as "circuit node," "power node," "ground node," "inverter," "voltage," "current," "CMOS (complementary metal oxide semiconductor)," "PMOS (P-channel metal oxide semiconductor) transistor," "NMOS (N-channel metal oxide semiconductor) transistor," "phase," "clock," "signal," and "loading." Terms and basic concepts like these are apparent to those of ordinary skill in the art and thus will not be explained in detail here. Those of ordinary skill in the art can also recognize symbols of PMOS transistor and NMOS transistor, and identify the "source," the "gate," and the "drain" terminals thereof.

This disclosure is presented in an engineering sense, instead of a rigorous mathematical sense. For instance, "A is equal to B" means "a difference between A and B is smaller than an engineering tolerance."

Throughout this disclosure, a ground node is used as a reference node of zero voltage (0V) electrical potential. A power supply node is denoted by "$V_{DD}$." A clock is a voltage signal that cyclically toggles back and forth between a low level (e.g. 0V) and a high level (e.g., the electrical potential at the power supply node "$V_{DD}$," or $V_{DD}$ for short). By way of example but not limitation, a 28 nm CMOS (complementary metal oxide semiconductor) process is used for circuit fabrication, and $V_{DD}$ is 1.1V throughout this disclosure.

Figure 2A:
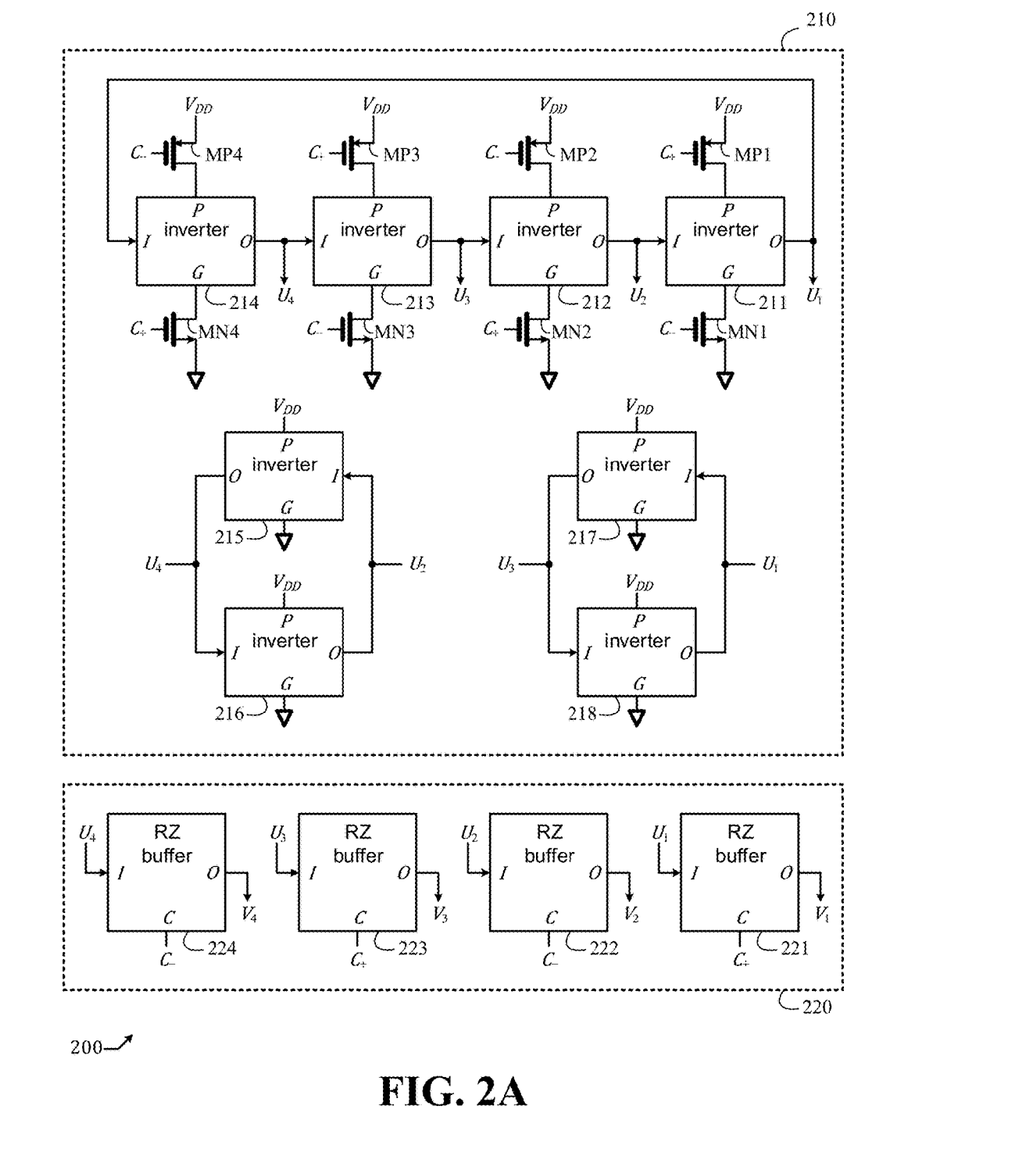
FIG. 2A shows a schematic diagram of a clock generator in accordance with an embodiment of the present disclosure.

A schematic diagram of a clock generator 200 in accordance with an embodiment of the present disclosure is depicted in FIG. 2A. Clock generator 200 comprises a divide-by-two circuit 210 configured to receive an input clock (which is a two-phase clock comprising a first phase $C_+$ and a second phase $C_-$) and output an interim clock (which is a four-phase clock comprising a first phase $U_1$, a second phase $U_2$, a third phase $U_3$, and a fourth phase $U_4$) and a duty converter 220 configured to receive the interim clock and output an output clock (which is a four-phase clock comprising a first phase $V_1$, a second phase $V_2$, a third phase $V_3$, and a fourth phase $V_4$). The divide-by-two circuit 210 comprises eight inverters including a first inverter 211, a second inverter 212, a third inverter 213, a fourth inverter 214, a fifth inverter 215, a sixth inverter 216, a seventh inverter 217, and an eighth inverter 218. The duty converter 220 comprises four return-to-zero (hereafter RZ for short) buffers including a first RZ buffer 221, a second RZ buffer 222, a third RZ buffer 223, and a fourth RZ buffer 224. The first, the second, the third, and the fourth inverter (i.e. inverters 211, 212, 213, and 214) are cascaded in a ring topology to output the first, the second, the third, and the fourth phases of the interim clock (i.e. $U_1$, $U_2$, $U_3$, and $U_4$), respectively. The second and the fourth inverters (i.e. inverters 212 and 214) are enabled during a first phase of the input clock wherein $C_+$ is high and $C_-$ is low, while the first and the third inverters (i.e. inverters 211 and 213) are enabled during a second phase of the input clock wherein $C_+$ is low and $C_-$ is high. The fifth and the sixth inverters (i.e. inverters 215 and 216) are configured in a cross-coupling topology to enforce a complementary relation between the second and the fourth phase of the interim clock (i.e. $U_2$ and $U_4$). The seventh and the eighth inverters (i.e. inverters 217 and 218) are configured in a cross-coupling topology to enforce a complementary relation between the first and the third phase of the interim clock (i.e. $U_1$ and $U_3$).

The first, the second, the third, and the fourth RZ buffer 221, 222, 223, and 224 are configured to receive the first, the second, the third, and the fourth phase of the interim clock (i.e. $U_1$, $U_2$, $U_3$, and $U_4$) and output the first, the second, the third, and the fourth phase of the output clock (i.e. $V_1$, $V_2$, $V_3$, and $V_4$), respectively. The first and the third RZ buffer 221 and 223 are controlled by the first phase of the input clock $C_+$, and the second and the fourth RZ buffer 222 and 224 are controlled by the second phase of the input clock $C_-$. Each inverter of said eight inverters 211~218 has an input pin labeled by "1," an output pin labeled by "0," a power pin labeled by "P," and a ground pin labeled by "G." Each inverter receives an input signal from its input pin "I" and output an output signal via its output pin "O." Each inverter is enabled when its power pin "P" is connected to $V_{DD}$ and its ground pin "G" is connected to ground. Clock generator further comprises four NMOS transistors MN1, MN2, MN3, and MN4 and four PMOS transistors MP1, MP2, MP3, and MP4. NMOS transistor MN1 (MN3) and PMOS transistor MP1 (MP3) are controlled by $C_-$ and $C_+$, respectively, and jointly embody the function of enabling the first (third) inverter 211 (213) by connecting its power pin "P" to $V_{DD}$ and connecting its ground pin "G" to ground during the second phase of the input clock wherein $C_+$ is low and $C_-$ is high. NMOS transistor MN2 (MN4) and PMOS transistor MP2 (MP4) are controlled by $C_+$ and $C_-$, respectively, and jointly embody the function of enabling the second (fourth) inverter 212 (214) by connecting its power pin "P" to $V_{DD}$ and connecting its ground pin "G" to ground during the first phase of the input clock wherein $C_+$ is high and $C_-$ is low. Each of the four RZ buffers 221, 222, 223, and 224 has an input pin labeled by "1," and output pin labeled by "0," and a control pin labeled by "C." RZ buffer 221 (222, 223, 224) receives $U_1$ ($U_2$, $U_3$, $U_4$) via its input pin "I" and output $V_1$ ($V_2$, $V_3$, $V_4$) via its output pin "O" in accordance with a control by $C_+$ ($C_-$, $C_+$, $C_-$) via its control pin "C."

In an alternative embodiment that is not explicitly shown in FIG. 2A but would be clear to those of ordinary skill in the art: NMOS transistor MN3 is removed and the ground pin "G" of inverter 213 is tied to the ground pin "G" of inverter 211; PMOS transistor MP3 is removed and the power pin "P" of inverter 213 is tied to the power pin "P" of inverter 211; NMOS transistor MN4 is removed and the ground pin "G" of inverter 214 is tied to the ground pin "G" of inverter 212; PMOS transistor MP4 is removed and the power pin "P" of inverter 214 is tied to the power pin "P" of inverter 212.

Figure 2B:
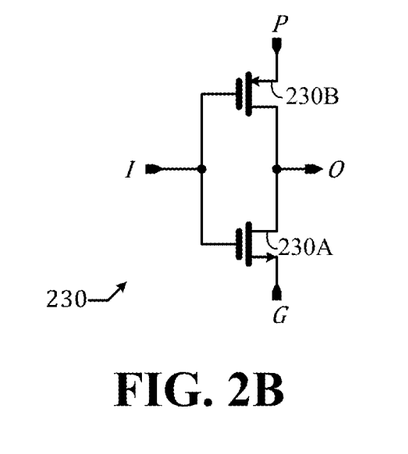
FIG. 2B shows a schematic diagram of an inverter.

A schematic diagram of an inverter 230 that can be instantiated to embody the eight inverters 211~218 is shown in FIG. 2B. Inverter 230 comprises: a NMOS transistor 230A and a PMOS transistor 230B. The source, the gate, and the drain of NMOS transistor 230A connect to the ground pin "G," the input pin "I," and the output pin "O," respectively; the source, the gate, and the drain of PMOS transistor 230B connect to the power pin "P," the input pin "I," and the output pin "O," respectively. In an embodiment, by way of example but not limitation: W/L (which stands for width/length) of each of the four NMOS transistors MN1~MN4 is 8.5 □m/30 nm; W/L of each of the four PMOS transistors MP1~MP4 is 10.92□m/30 nm; when instantiating inverter 230 to embody inverters 211, 212, 213, and 214, W/L of NMOS transistor 230A is 3 □m/30 nm, and W/L of PMOS transistor 230B is 3.9 □m/30 nm; and when instantiating inverters 230 to embody inverters 215, 216, 217, and 218, W/L of NMOS transistor 230A is 1.8 □m/30 nm, and W/L of PMOS transistor 230B is 2.34 □m/30 nm. In any case, inverters 211~214 are appreciably stronger than inverters 215~218. Here, a strength of an inverter refers to its current-driving capability, and an inverter comprising MOS transistors of a larger width-to-length ratio is stronger than an inverter comprising MOS transistors of a smaller width-to-length ratio. By way of example but not limitation, inverters 211~214 are approximately 67% stronger than inverters 215~218.

Figure 2C:
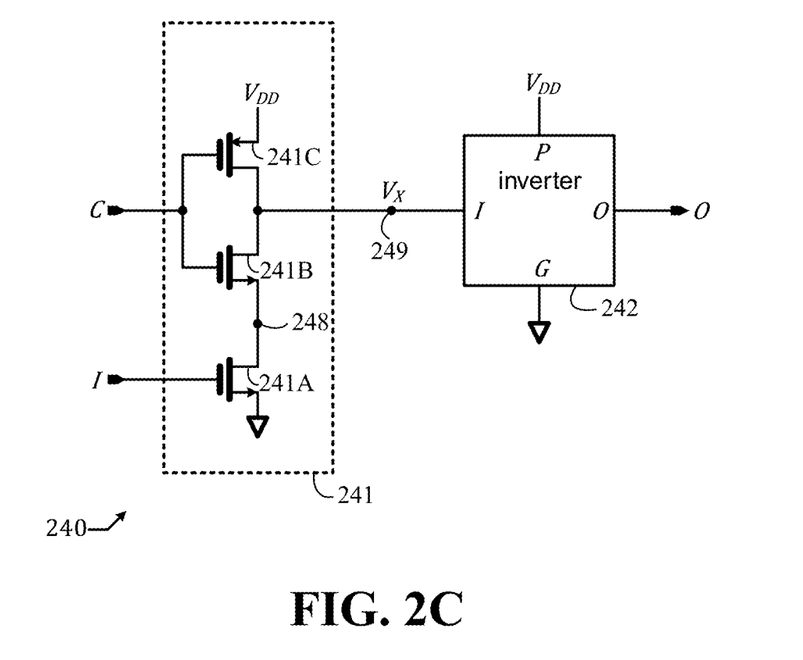
FIG. 2C shows a schematic diagram of a return-to-zero buffer.

A schematic diagram of a RZ buffer 240 that can be instantiated to embody RZ buffers 221, 222, 223, and 224 is shown in FIG. 2C. RZ buffer 240 comprises: a return-to-one inverter 241 configured to receive an input signal from the input pin "I" and output an inter-stage signal $V_X$ to an inter-stage node 249 in accordance with a control signal received via the control pin "C"; and an inverter 242 configured to receive the inter-stage signal $V_X$ and output the output signal to the output pin "O." When the control signal at the control pin "C" is low, the RZ buffer 240 is reset; when the control signal at the control pin "C" is high, the RZ buffer 240 is enabled. The return-to-one inverter 241 comprises: a first NMOS transistor 241A, a second NMOS transistor 241B, and a PMOS transistor 241C. The source, the gate, and the drain of NMOS transistor 241A connect to ground, the input pin "I," and an internal node 248, respectively. The source, the gate, and the drain of NMOS transistor 241B connect to the internal node 248, the control pin "C," and the inter-stage node 249, respectively. The source, the gate, and the drain of PMOS transistor 241C connect to $V_{DD}$, the control pin "C," and the inter-stage node 249, respectively. When the control signal at the control pin "C" is low, the inter-stage signal $V_X$ will be high (i.e. $V_{DD}$; "return-to-one") regardless of the input signal at the input pin "I"; when the control signal at the control pin "C" is high, the intermediate signal $V_X$ will remain high if the input signal at the input pin "I" is low, or be pulled down to ground if the input signal at the input pin "I" is high. Thanks to inverter 242, the output signal at the output pin "O" is an inversion of the inter-stage signal $V_X$. Therefore, when the control signal at the control pin "C" is low, the output signal at the output pin "O" will be low (i.e. ground; "return-to-zero") regardless of the input signal at the input pin "I"; when the control signal at the control pin "C" is high, the output signal at the control pin "O" will remain low if the input signal at the input pin "I" is low, or rise to $V_{DD}$ if the input signal at the input pin "I" is high. In an embodiment, by way of example but not limitation: W/L of NMOS transistor 241A is 6.4 □m/30 nm; W/L of NMOS transistor 241B is 7.2 □m/30 nm; W/L of PMOS transistor 241C is 4.68 □m/30 nm; inverter 230 is instantiated to embody inverter 242 with W/L of NMOS transistor 230A being 4.8 □m/30 nm, and W/L of PMOS transistor 230B being 9.36□m/30 nm.

Figure 3:
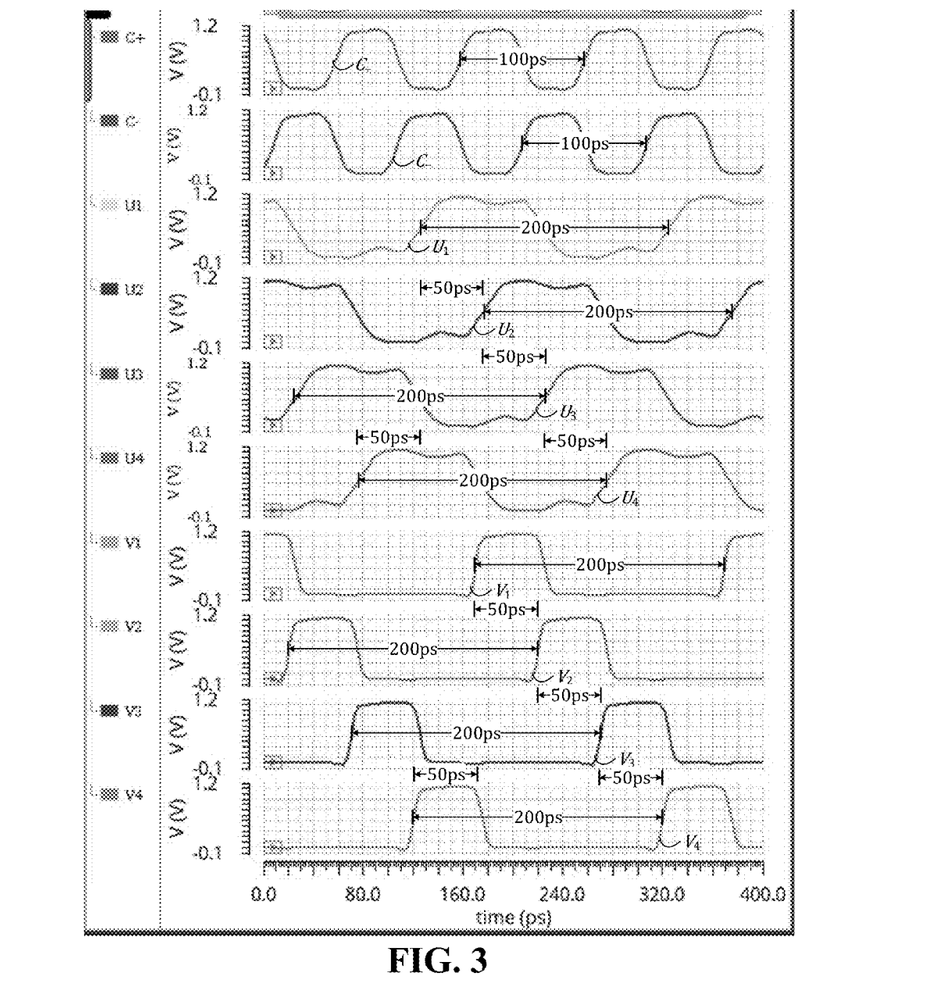
FIG. 3 shows a simulation result of the clock generator of FIG. 2A.

A simulation result of quadrature clock generator 200 is shown in FIG. 3. Here, a fundamental frequency of the two-phase input clock is 10 GHz. $C_+$ and $C_-$ are complementary and have the same period of 100 ps. $U_1$, $U_2$, $U_3$, and $U_4$ have the same period of 200 ps and the same duty cycle of approximately 50%. A difference in timing between $U_1$ ($U_2$, $U_3$, $U_4$) and $U_2$ ($U_3$, $U_4$, $U_1$) is 50 ps. $V_1$, $V_2$, $V_3$, and $V_4$ have the same period of 200 ps and the same duty cycle of approximately 25%. A difference in timing between $V_1$ ($V_2$, $V_3$, $V_4$) and $V_2$ ($V_3$, $V_4$, $V_1$) is 50 ps. Note that the cross-coupling of inverters 215 and 216 enforces a complementary relation between $U_2$ and $U_4$, and the cross-coupling of inverters 217 and 218 enforces a complementary relation between $U_1$ and $U_3$, as clearly shown in FIG. 3.

Divide-by-two circuit 210 is by nature faster than divide-by-two circuit 101 of FIG. 1A. For any of the four phases $U_1$, $U_2$, $U_3$, and $U_4$, there will always be a PMOS transistor working to pull up all along the process of a low-to-high toggling, and a NMOS transistor working to pull down all along the process of a high-to-low toggling. RZ buffer 240 is by nature faster than AND gate, as there are fewer transistors and lighter loading. Therefore, clock generator 200 is by nature faster than clock generator 100 of FIG. 1A.

Figure 4:
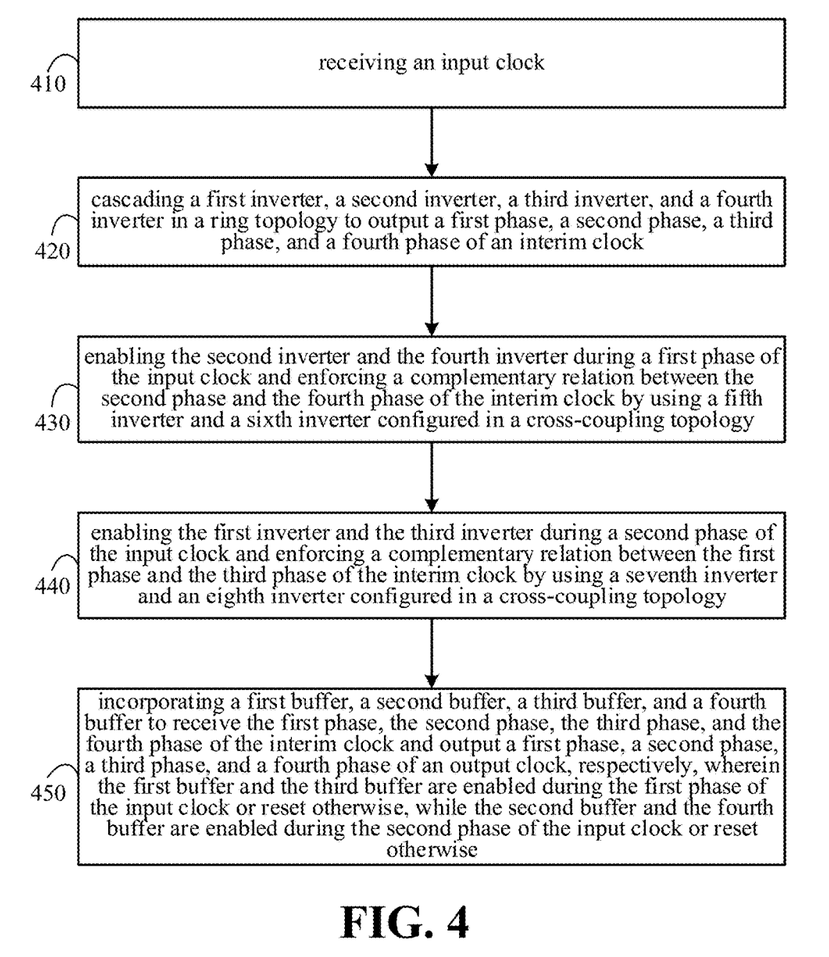
FIG. 4 shows a flow diagram of a method in accordance with an embodiment of the present disclosure.

As depicted in a flow diagram shown in FIG. 4, a method in accordance with an embodiment of the present disclosure includes the following steps: (step 410) receiving an input clock; (step 420) cascading a first inverter, a second inverter, a third inverter, and a fourth inverter in a ring topology to output a first phase, a second phase, a third phase, and a fourth phase of an interim clock; (step 430) enabling the second inverter and the fourth inverter during a first phase of the input clock and enforcing a complementary relation between the second phase and the fourth phase of the interim clock by using a fifth inverter and a sixth inverter configured in a cross-coupling topology; (step 440) enabling the first inverter and the third inverter during a second phase of the input clock and enforcing a complementary relation between the first phase and the third phase of the interim clock by using a seventh inverter and an eighth inverter configured in a cross-coupling topology; and (step 450) incorporating a first buffer, a second buffer, a third buffer, and a fourth buffer to receive the first phase, the second phase, the third phase, and the fourth phase of the interim clock and output a first phase, a second phase, a third phase, and a fourth phase of an output clock, respectively, wherein the first buffer and the third buffers are enabled during the first phase of the input clock or reset otherwise, while the second buffer and the fourth buffer are enabled during the second phase of the input clock or reset otherwise.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A clock generator comprising a divide-by-two circuit configured to receive an input clock and output an interim clock, and a duty converter configured to receive the interim clock and output an output clock, wherein:
    the divide-by-two circuit comprises eight inverters;
    the duty converter comprises four buffers;
    a first, a second, a third, and a fourth inverter among said eight inverters are configured in a ring topology to output a first, a second, a third, and a fourth phase of the interim clock, respectively;
    the second and the fourth inverter are enabled during a first phase of the input clock;
    the first and the third inverter are enabled during a second phase of the input clock;
    a fifth and a sixth inverter among said eight inverters are configured in a cross-coupling topology to enforce a complementary relation between the second and the fourth phase of the interim clock;
    a seventh and an eighth inverter of said eight inverters are configured in a cross-coupling topology to enforce a complementary relation between the first and the third phase of the interim clock;
    a first, a second, a third, and a fourth buffer among said four buffers are configured to receive the first, the second, the third, and the fourth phases of the interim clock and output a first, a second, a third, and a fourth phase of the output clock, respectively;
    the first and the third buffer are enabled during the first phase of the input clock or reset otherwise; and
    the second and the fourth buffer are enabled during the second phase of the input clock or reset otherwise.

2. The clock generator of claim 1, wherein each of said eight inverters has an input pin, an output pin, a power pin, and a ground pin.

3. The clock generator of claim 2, wherein: the first inverter receives the second phase of the interim clock via its input pin and outputs the first phase of the interim clock via its output pin; the power pin of the first inverter connects to a power node via a PMOS transistor controlled by the first phase of the input clock; and the ground pin of the first inverter connects to a ground node via a NMOS transistor controlled by the second phase of the input clock.

4. The clock generator of claim 2, wherein: the second inverter receives the third phase of the interim clock via its input pin and outputs the second phase of the interim clock via its output pin; the power pin of the second inverter connects to a power node via a PMOS transistor controlled by the second phase of the input clock; and the ground pin of the second inverter connects to a ground node via a NMOS transistor controlled by the first phase of the input clock.

5. The clock generator of claim 2, wherein: the third inverter receives the fourth phase of the interim clock via its input pin and outputs the third phase of the interim clock via its output pin; the power pin of the third inverter connects to a power node via a PMOS transistor controlled by the first phase of the input clock; and the ground pin of the third inverter connects to a ground node via a NMOS transistor controlled by the second phase of the input clock.

6. The clock generator of claim 2, wherein: the fourth inverter receives the first phase of the interim clock via its input pin and outputs the fourth phase of the interim clock via its output pin; the power pin of the fourth inverter connects to a power node via a PMOS transistor controlled by the second phase of the input clock; and the ground pin of the fourth inverter connects to a ground node via a NMOS transistor controlled by the first phase of the input clock.

7. The clock generator of claim 1, wherein each of said four buffers has an input pin configured to receive an input signal, an output pin configured to output an output signal, and a control pin configured to receive a control signal.

8. The clock generator of claim 7, wherein: the input signal, the output signal, and the control signal of the first buffer are the first phase of the interim clock, the first phase of the output clock, and the first phase of the input clock, respectively; the input signal, the output signal, and the control signal of the second buffer are the second phase of the interim clock, the second phase of the output clock, and the second phase of the input clock, respectively; the input signal, the output signal, and the control signal of the third buffer are the third phase of the interim clock, the third phase of the output clock, and the first phase of the input clock, respectively; the input signal, the output signal, and the control signal of the fourth buffer are the fourth phase of the interim clock, the fourth phase of the output clock, and the second phase of the input clock, respectively.

9. The clock generator of claim 7, wherein each of said buffers comprises: a return-to-one inverter configured to receive the input signal and output an inter-stage signal at an inter-stage node in accordance with the control signal, and an inverter configured to receive the inter-stage signal and output the output signal.

10. The clock generator of claim 9, wherein: the return-to-one inverter comprises a first NMOS transistor, a second NMOS transistor, and a PMOS transistor; the source, the gate, and the drain of the first NMOS transistor connect to a ground node, the input pin, and an internal node, respectively; the source, the gate, and the drain of the second NMOS transistor connect to the internal node, the control pin, and the inter-stage node, respectively; and the source, the gate, and the drain of the PMOS transistor connect to a power node, the control pin, and the inter-stage node, respectively.

11. A method comprising:
receiving an input clock;
cascading a first inverter, a second inverter, a third inverter, and a fourth inverter in a ring topology to output a first phase, a second phase, a third phase, and a fourth phase of an interim clock;
enabling the second inverter and the fourth inverter during a first phase of the input clock and enforcing a complementary relation between the second phase and the fourth phase of the interim clock by using a fifth inverter and a sixth inverter configured in a cross-coupling topology;
enabling the first inverter and the third inverter during a second phase of the input clock and enforcing a complementary relation between the first phase and the third phase of the interim clock by using a seventh inverter and an eighth inverter configured in a cross-coupling topology; and
incorporating a first buffer, a second buffer, a third buffer, and a fourth buffer to receive the first phase, the second phase, the third phase, and the fourth phase of the interim clock and output a first phase, a second phase, a third phase, and a fourth phase of an output clock, respectively, wherein the first buffer and the third buffer are enabled during the first phase of the input clock or reset otherwise, while the second buffer and the fourth buffer are enabled during the second phase of the input clock or reset otherwise.

12. The method of claim 11, wherein each of said inverters has an input pin, an output pin, a power pin, and a ground pin.

13. The method of claim 12, wherein: the first inverter receives the second phase of the interim clock via its input pin and outputs the first phase of the interim clock via its output pin; the power pin of the first inverter connects to a power node via a PMOS transistor controlled by the first phase of the input clock; and the ground pin of the first inverter connects to a ground node via a NMOS transistor controlled by the second phase of the input clock.

14. The method of claim 12, wherein: the second inverter receives the third phase of the interim clock via its input pin and outputs the second phase of the interim clock via its output pin; the power pin of the second inverter connects to a power node via a PMOS transistor controlled by the second phase of the input clock; and the ground pin of the second inverter connects to a ground node via a NMOS transistor controlled by the first phase of the input clock.

15. The method of claim 12, wherein: the third inverter receives the fourth phase of the interim clock via its input pin and outputs the third phase of the interim clock via its output pin; the power pin of the third inverter connects to a power node via a PMOS transistor controlled by the first phase of the input clock; and the ground pin of the third inverter connects to a ground node via a NMOS transistor controlled by the second phase of the input clock.

16. The method of claim 12, wherein: the fourth inverter receives the first phase of the interim clock via its input pin and outputs the fourth phase of the interim clock via its output pin; the power pin of the fourth inverter connects to a power node via a PMOS transistor controlled by the second phase of the input clock; and the ground pin of the fourth inverter connects to a ground node via a NMOS transistor controlled by the first phase of the input clock.

17. The method of claim 11, wherein each of said buffers has an input pin configured to receive an input signal, an output pin configured to output an output signal, and a control pin configured to receive a control signal.

18. The method of claim 17, wherein: the input signal, the output signal, and the control signal of the first buffer are the first phase of the interim clock, the first phase of the output clock, and the first phase of the input clock, respectively; the input signal, the output signal, and the control signal of the second buffer are the second phase of the interim clock, the second phase of the output clock, and the second phase of the input clock, respectively; the input signal, the output signal, and the control signal of the third buffer are the third phase of the interim clock, the third phase of the output clock, and the first phase of the input clock, respectively; the input signal, the output signal, and the control signal of the fourth buffer are the fourth phase of the interim clock, the fourth phase of the output clock, and the second phase of the input clock, respectively.

19. The method of claim 17, wherein each of said buffers comprises: a return-to-one inverter configured to receive the input signal and output an inter-stage signal at an inter-stage node in accordance with the control signal, and an inverter configured to receive the inter-stage signal and output the output signal.

20. The method of claim 19, wherein: the return-to-one inverter comprises a first NMOS transistor, a second NMOS transistor, and a PMOS transistor; the source, the gate, and the drain of the first NMOS transistor connect to a ground node, the input pin, and an internal node, respectively; the source, the gate, and the drain of the second NMOS transistor connect to the internal node, the control pin, and the inter-stage node, respectively; and the source, the gate, and the drain of the PMOS transistor connect to a power node, the control pin, and the inter-stage node, respectively.

* * * * *